(12) United States Patent
Suda et al.

(10) Patent No.: US 9,355,866 B2
(45) Date of Patent: May 31, 2016

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Hitachi Kokusai Electric Inc., Tokyo (JP)

(72) Inventors: Atsuhiko Suda, Toyama (JP); Satoshi Shimamoto, Toyama (JP); Naofumi Ohashi, Toyama (JP)

(73) Assignee: Hitachi Kokusai Elecetric, Inc., Tokyo (JP)

( * ) Notice: Subject to any disclaimer, the term of this patent is extended or adjusted under 35 U.S.C. 154(b) by 0 days.

(21) Appl. No.: 14/669,764

(22) Filed: Mar. 26, 2015

(65) Prior Publication Data
US 2016/0093512 A1 Mar. 31, 2016

(30) Foreign Application Priority Data

Sep. 30, 2014 (JP) .................................. 2014-199910
Feb. 23, 2015 (JP) .................................. 2015-032843

(51) Int. Cl.
*H01L 21/3213* (2006.01)
*C23C 16/52* (2006.01)
*C23C 16/46* (2006.01)
*C23C 16/458* (2006.01)
(Continued)

(52) U.S. Cl.
CPC ........ *H01L 21/32139* (2013.01); *C23C 16/345* (2013.01); *C23C 16/455* (2013.01); *C23C 16/458* (2013.01); *C23C 16/46* (2013.01); *C23C 16/52* (2013.01); *H01L 21/0217* (2013.01); *H01L 21/0332* (2013.01)

(58) Field of Classification Search
CPC ..................... H01L 21/32139; H01L 21/0332; H01L 21/0217; C23C 16/455; C23C 16/458; C23C 16/52; C23C 16/46; C23C 16/345
See application file for complete search history.

(56) References Cited

U.S. PATENT DOCUMENTS 6,270,929 B1 * 8/2001 Lyons ................. H01L 21/0273
257/E21.026
6,932,871 B2 * 8/2005 Chang ............... C23C 16/45512
118/719

(Continued)

FOREIGN PATENT DOCUMENTS

JP 199911111683 4/1999
JP 199911274030 10/1999

(Continued)

Primary Examiner — William Coleman
(74) Attorney, Agent, or Firm — Edell, Shapiro & Finnan LLC (57) ABSTRACT

Provided is a configuration capable of suppressing a variation in characteristics of transistor. The configuration includes: a process chamber; a gas supply unit configured to supply a hard mask forming gas into the process chamber; a substrate support table configured to support a substrate $W_n$ of an $n^{th}$ lot having a film to be etched formed thereon; a heater embedded in the substrate support table; and a controller configured to control a temperature distribution of the heater based on an etching information of a substrate $W_m$ of an $m^{th}$ lot processed prior to the $n^{th}$ lot.

18 Claims, 8 Drawing Sheets

(51) Int. Cl.
*C23C 16/455* (2006.01)
*C23C 16/34* (2006.01)
*H01L 21/033* (2006.01)
*H01L 21/02* (2006.01)

(56) References Cited

U.S. PATENT DOCUMENTS 7,019,253 B2 * 3/2006 Johnson ............... H05H 1/46
  118/723 I
8,093,116 B2 * 1/2012 Chung ............ H01L 21/823842
  257/E21.023
2003/0000922 A1 * 1/2003 Subramanian ..... G01N 21/4738
  216/60
2003/0183613 A1 10/2003 Takano
2012/0074126 A1 * 3/2012 Bang ................. H01L 21/68785
  219/443.1
2014/0106577 A1 4/2014 Tonegawa et al.
2015/0118822 A1 * 4/2015 Zhang ............... H01L 21/76224
  438/433

FOREIGN PATENT DOCUMENTS

JP  2003282461  10/2003
JP  2014082322  5/2014

* cited by examiner

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS REFERENCE TO RELATED APPLICATIONS

This application claims foreign priority under 35 U.S.C. §119(a)-(d) to Application No. JP 2014-199910 filed on Sep. 30, 2014 and Japanese Application No. JP 2015-032843 filed on Feb. 23, 2015, the entire contents of which are hereby incorporated by reference.

FIELD OF THE INVENTION

The present invention relates to a substrate processing apparatus, a method of manufacturing a semiconductor device and a non-transitory computer-readable recording medium.

BACKGROUND

Semiconductor devices have recently tended toward high integration. Thus, sizes of patterns of transistors used in the semiconductor devices have become remarkably minute. For example, when gate electrodes of the transistors are formed, the sizes of the patterns become minute. In the case of 45 nm generation transistors, a width of, for instance, less than 40 nm is required for gate electrodes. The patterns are formed by a process of forming a hard mask or a resist, a lithography process, an etching process, or the like.

Meanwhile, in the case of a semiconductor device employing a plurality of transistors, there is a need to make performance of each transistor uniform in order to suppress a variation in performance. In order to provide the uniform performance, a width of a gate electrode which corresponds to a flow path length affecting characteristics of the transistor is preferably made uniform. A variation in the width of the gate electrode has, for instance, an allowance of about 10%.

SUMMARY

Accordingly, an object of the present invention is to provide a configuration capable of suppressing a variation in characteristics of transistor.

According to one aspect of the present invention, there is provided a configuration including: a process chamber; a gas supply unit configured to supply a hard mask forming gas into the process chamber; a substrate support table configured to support a substrate $W_n$ of an $n^{th}$ lot having a film to be etched formed thereon; a heater embedded in the substrate support table; and a controller configured to control a temperature distribution of the heater based on etching information of a substrate $W_m$ of an $m^{th}$ lot processed prior to the $n^{th}$ lot.

DETAILED DESCRIPTION

First Embodiment of the Present Invention

Hereinafter, a semiconductor manufacturing method (which is also referred to as "substrate processing method") according to an embodiment of the present invention will be described with reference to the drawings. In the present embodiment, a substrate to be processed may include, for instance, a semiconductor wafer substrate (hereinafter referred to simply as "wafer") on which a semiconductor device is manufactured.

(1) Process of Forming Gate Electrode

A process of forming a gate electrode in the present embodiment will be described using FIG. 1.

[Process of Forming a Hard Mask Film]

Figure 1A:
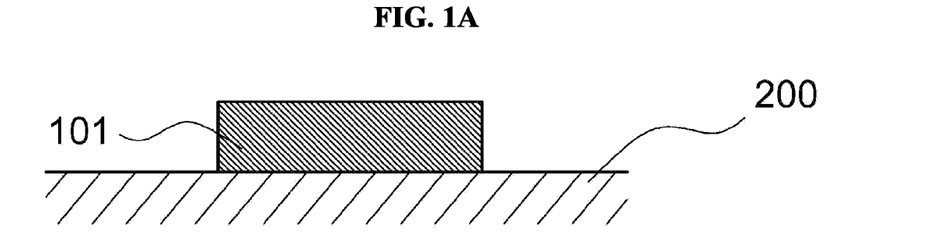
FIGS. 1A to 1F are explanatory views for describing a method of forming a gate electrode according to an embodiment of the present invention.
Figure 1B:
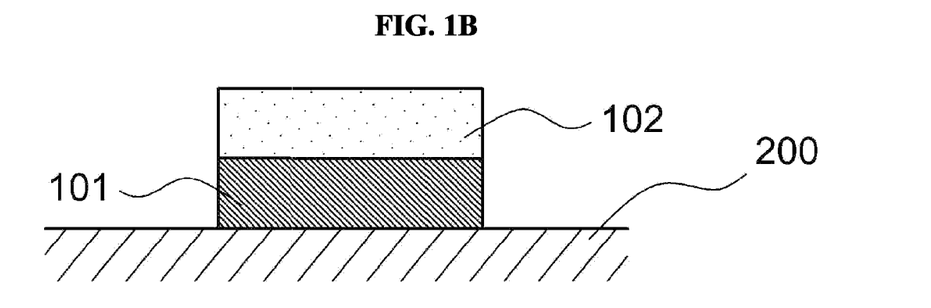

A description will be made using FIGS. 1A and 1B. A silicon nitride (SiN) film 102 acting as a hard mask film as illustrated in FIG. 1B is formed on a poly-Si film 101 formed on a wafer 200 illustrated in FIG. 1A by a film forming process using a film forming apparatus to be described below. The poly-Si film 101 is a layer that becomes a gate electrode in a subsequent process and is also called a film to be etched. The hard mask film 102 also functions as an anti-reflection film.

Here, the reason why the hard mask film is formed will be described. According to recent miniaturization, there is a need to thin a resist in a resist forming process to be described below. However, since etching resistance of the resist is degraded with the film thinning, the resist may be lost during an etching process. For this reason, a technique in which a hard mask having high etching resistance is used as the anti-reflection film located under the resist is employed.

[Resist Film Forming Process]

Figure 1C:
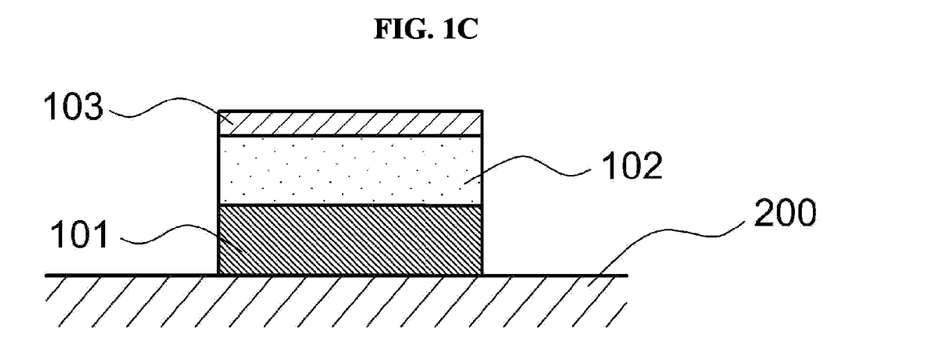

A description will be made using FIG. 1C. A resist film 103 is formed on the hard mask film 102 using a resist coater.

[Exposure Process]

Figure 1D:
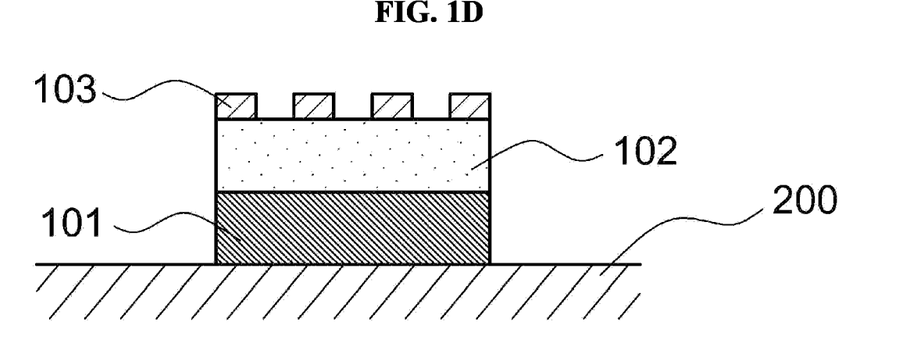

A description will be made using FIG. 1D. A resist film 103 is formed on the hard mask film 102, and then a desired pattern is exposed by an exposure device.

[Etching Process]

Figure 1E:
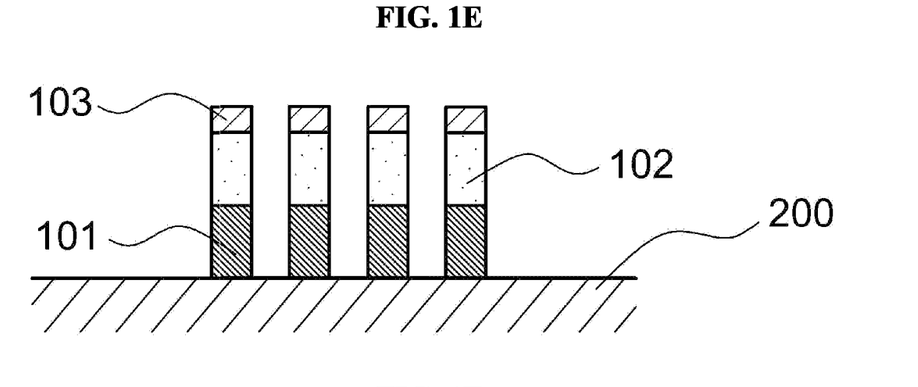

A description will be made using FIG. 1E. After the exposure process, a dry etching process based on plasma is performed to form grooves in the poly-Si film 101 using an etching device to be described below. An insulating film formed of, for instance, a silicon oxide film is embedded in the grooves in the subsequent process.

[Resist Film and Hard Mask Film Removing Process]

Figure 1F:
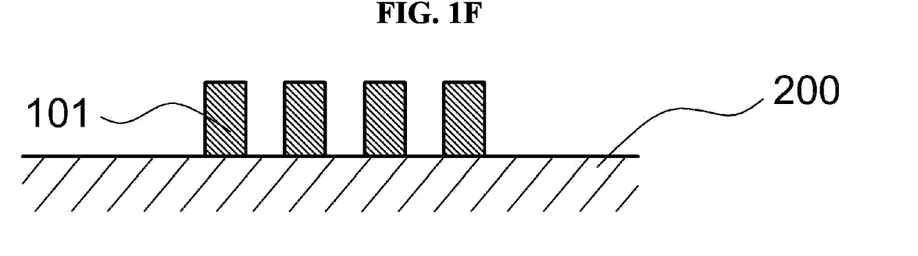

A description will be made using FIG. 1F. After the etching process, the resist film 103 and the hard mask film 102 above the poly-Si film 101 are removed.

In this way, a plurality of poly-Si films 101 are formed on the wafer 200.

(2) Configuration of Substrate Processing Apparatus (Film Forming Apparatus)

Next, a substrate processing apparatus 2000 configured to form the hard mask film will be described. The substrate processing apparatus is also called a film forming apparatus. The substrate processing apparatus according to the present embodiment is includes a single wafer type substrate processing apparatus that processes substrates to be processed one by one.

Figure 2:
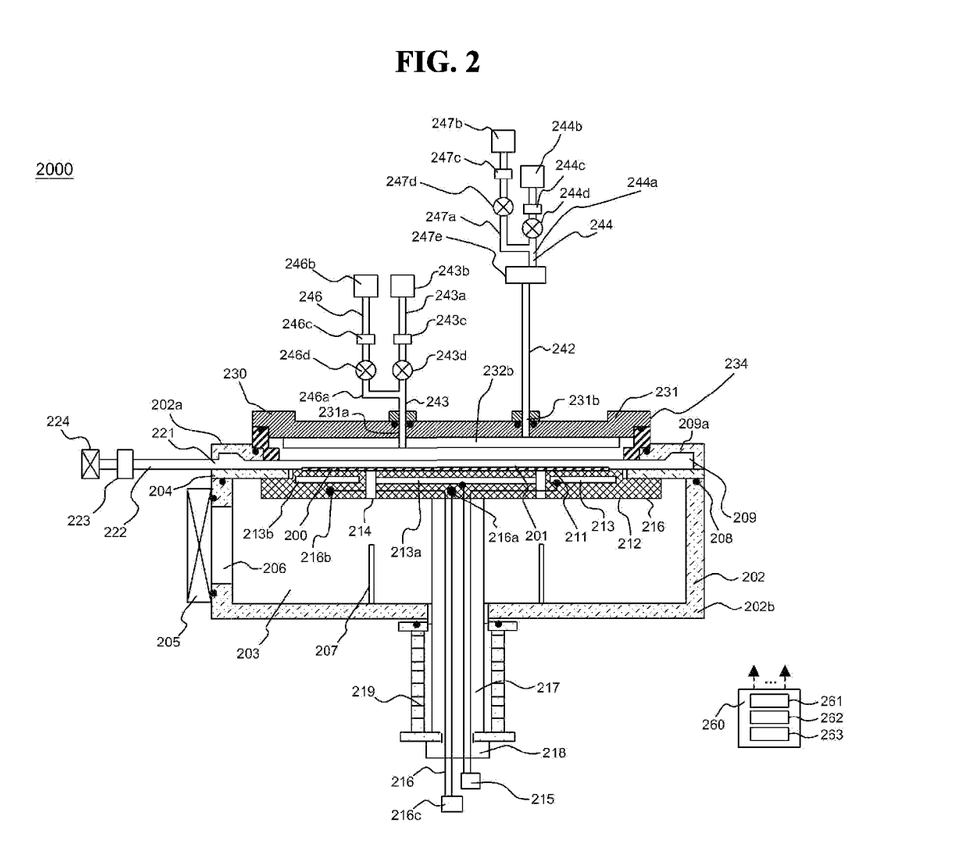
FIG. 2 is a schematic configuration view of a single wafer type film forming apparatus according to the embodiment of the present invention.

Hereinafter, a configuration of the substrate processing apparatus according to the present embodiment will be described with reference to FIG. 2. FIG. 2 is a schematic configuration view of a single wafer type substrate processing apparatus according to the present embodiment.

[Processing Container]

The substrate processing apparatus 2000 is equipped with a process container 202. The process container 202 is configured, for instance, as a hermetic container that has a circular cross section and is flat. Further, the process container 202 is formed of a metal material such as aluminum (Al) or stainless steel (SUS). A process chamber 201 in which the wafer 200 such as a silicon wafer acting as a substrate is processed and a transfer space 203 through which the wafer 200 passes when the wafer 200 is transferred to the process chamber 201 are formed in the process container 202. The process container 202 is made up of an upper container 202a and a lower container 202b. A partition plate 204 is installed between the upper container 202a and the lower container 202b.

An exhaust buffer chamber 209 is installed in the vicinity of a peripheral edge of an interior of the upper container 202a.

A substrate loading exit 206 adjacent to a gate valve 205 is provided in a side of the lower container 202b. The wafer 200 moves between the lower container 202b and a transfer chamber (not shown) via the substrate loading exit 206. A plurality of elevation pins 207 are installed at the bottom of the lower container 202b.

[Substrate Support Table]

A substrate support table 210 supporting the wafer 200 is installed in the process chamber 201. The substrate support table 210 mainly includes a substrate placement surface 211 on which the wafer 200 is placed, a substrate placement table 212 whose surface has the substrate placement surface 211 and a heater 213 that is contained in the substrate placement surface 211 and acts as a heating source. The substrate placement table 212 is provided with through-holes 214 through which the elevation pins 207 pass at respective positions corresponding to the elevation pins 207.

The substrate placement table 212 is supported by a shaft 217. The shaft 217 passes through the bottom of the process container 202, and is further connected to an elevating mechanism 218 outside the process container 202. The elevating mechanism 218 is operated to raise/lower the shaft 217 and the substrate placement table 212, thereby making it possible to raise/lower the wafer 200 placed on the substrate placement surface 211. Further, a circumference of a lower end of the shaft 217 is covered by bellows 219, and the inside of the process container 202 is maintained in an airtight state.

The substrate placement table 212 is lowered to a position (wafer transferring position) at which the substrate placement surface 211 is opposite to the substrate loading exit 206 when the wafer 200 is transferred, and is raised until the wafer 200 reaches a processing position (wafer processing position) in the process chamber 201 as illustrated in FIG. 2 when the wafer 200 is processed.

To be specific, when the substrate placement table 212 is lowered to the wafer transferring position, upper ends of the elevation pins 207 protrude from the top of the substrate placement surface 211 such that the elevation pins 207 support the wafer 200 from below. Further, when the substrate placement table 212 is raised to the wafer processing position, the elevation pins 207 are embedded from the top of the substrate placement surface 211 such that the substrate placement surface 211 supports the wafer 200 from below. Further, since the elevation pins 207 come into direct contact with the wafer 200, the elevation pins 207 are preferably formed of a material such as quartz or alumina.

The heater 213 is a component that can individually control the heating of a center portion that is the center of the wafer 200 and a peripheral portion that is a circumference outside the center portion. For example, the heater 213 includes a center zone heater 213a that is installed in the center of the substrate placement surface 211 and has an annular shape when viewed from the top and an outer zone heater 213b that has an annular shape and is installed on an outer circumference of the center zone heater 213a. The center zone heater 213a heats the center portion of the wafer, and the outer zone heater 213b heats the peripheral portion of the wafer.

The center zone heater 213a and the outer zone heater 213b are connected to a heater temperature controller 215 via respective heater power supply cables. The heater temperature controller 215 controls the supply of power to each heater, thereby controlling temperatures of the center and peripheral portions of the wafer 200.

Temperature measuring detectors 216a and 216b for measuring the temperature of the wafer 200 are embedded in the substrate placement table 212. The temperature measuring detector 216a is installed in the center portion of the substrate placement table 212 so as to measure an ambient temperature of the center zone heater 213a. The temperature measuring detector 216b is installed in the peripheral portion of the substrate placement table 212 so as to measure an ambient temperature of the outer zone heater 213b. The temperature measuring detectors 216a and 216b are connected to a temperature information receiver 216c. The temperature measured by each temperature measuring detector is transmitted to the temperature information receiver 216c. The temperature information receiver 216c transmits the received temperature information to a controller 260 to be described below. The controller 260 controls a temperature of the heater based on the received temperature information or etching information to be described below. Further, the temperature measuring detector 216a, the temperature measuring detector 216b, and the temperature information receiver 216c constitute a temperature detector 216.

[Shower Head]

A shower head 230 acting as a gas dispersion mechanism is installed at an upper portion (upstream side in a gas supply direction) of the process chamber 201. A cover 231 of the shower head 230 is provided with gas inlets 231a and 231b. A gas supply system to be described below is connected to the gas inlets 231a and 231b. Gases introduced through the gas inlets 231a and 231b are supplied to a buffer space 232 of the shower head 230.

The buffer space 232 includes a first buffer space 232a and a second buffer space 232b. The first buffer space 232a is embedded in a dispersion plate 234. The second buffer space 232b is disposed between the cover 231 and the dispersion plate 234.

The shower head 230 is equipped with the dispersion plate 234. The dispersion plate 234 disperses the gases supplied through the gas inlets 231a and 231b. An upstream side of the dispersion plate 234 is the second buffer space 232b, and a downstream side of the dispersion plate 234 is the process chamber 201. The dispersion plate 234 is provided with a plurality of through-holes 234c and 234d as will be described below. The dispersion plate 234 is disposed to face the substrate placement surface 211.

[Gas Supply System]

A gas supply pipe 243a acting as a first gas supply pipe passes through the gas inlet 231a formed in the cover 231 of the shower head 230. A gas supply pipe 242 acting as a second gas supply pipe is connected to the gas inlet 231b. The gas supply pipe 243a is connected to the first buffer space 232a embedded in the shower head 230 to be described below. The gas supply pipe 242 is connected to the gas inlet 231b, thereby communicating with the second buffer space 232b.

A gas supply pipe 244a is connected to the gas supply pipe 242 via a remote plasma generator (remote plasma unit, RPU) 244e.

A first gas is mainly supplied through a first gas supply system 243 including the first gas supply pipe 243a. A second gas is mainly supplied through a second gas supply system 244 including the second gas supply pipe 242 and the gas supply pipe 244a.

[First Gas Supply System]

The first gas supply pipe 243a is provided with a first gas supply source 243b, a mass flow controller (MFC) 243c that is a flow rate controller (flow rate controller), and a valve 243d that is an opening/closing valve, sequentially from an upstream direction. Thus, the first gas is supplied into the first buffer space 232a through the first gas supply pipe 243a via the MFC 243c and the valve 243d.

The first gas is one of the process gases, and is, for instance, a hexachlorodisilane ($Si_2Cl_6$, abbreviated to HCDS) gas that is a raw material including a silicon (Si) element. Further, the first gas may include any one of a solid, a liquid, and a gas at room temperature and normal pressure. When the first gas is a liquid at room temperature and normal pressure, a vaporizer (not shown) may be provided between the first gas supply source 243b and the mass flow controller 243c. Here, a description will be made using a gas.

The first gas supply system 243 is mainly constituted by the first gas supply pipe 243a, the MFC 243c, and the valve 243d. Alternatively, the first gas supply system 243 may be considered to include the first gas supply source 243b and a first inert gas supply system to be described below. Further, the first gas supply system 243 belongs to one of the process gas supply systems, because it supplies the first gas that is one of the process gases.

A downstream end of a first inert gas supply pipe 246a is connected to a downstream side of the first gas supply pipe 243a relative to the valve 243d. The first inert gas supply pipe 246a is provided with an inert gas supply source 246b, a mass flow controller (MFC) 246c that is a flow rate controller (flow rate controller), and a valve 246d that is an opening/closing valve, sequentially from an upstream direction. Thus, an inert gas is supplied into the first buffer space 232a through the first inert gas supply pipe 246a via the MFC 246c, the valve 246d, and the first gas supply pipe 243a.

The inert gas functions as a carrier gas of the first gas, and preferably uses a gas that does not react with the first gas. Specifically, the inert gas may use, for instance, nitrogen ($N_2$) gas. As the inert gas, a rare gas such as helium (He) gas, neon (Ne) gas, or argon (Ar) gas may be used in addition to the $N_2$ gas.

The first inert gas supply system is mainly constituted by the first inert gas supply pipe 246a, the MFC 246c, and the valve 246d. Alternatively, the first inert gas supply system may be considered to include the inert gas supply source 246b and the first gas supply pipe 243a. Further, the first inert gas supply system may be considered to be included in the first gas supply system 243.

[Second Gas Supply System]

The RPU 244e is installed downstream on the gas supply pipe 244a connected to the second gas supply pipe 242. A second gas supply source 244b, a mass flow controller (MFC) 244c that is a flow rate controller (flow rate controller), and a valve 244d that is an opening/closing valve are installed upstream, sequentially from the upstream direction. Thus, the second gas is supplied into the shower head 230 through the gas supply pipe 244a via the MFC 244c, the valve 244d, the RPU 244e, and the second gas supply pipe 242. The second gas is converted into a plasma state by the RPU 244e, and is applied onto the wafer 200.

The second gas is one of the process gases, and, for instance, ammonia ($NH_3$) gas is used as the second gas.

The second gas supply system 244 is mainly constituted by the second gas supply pipe 242, the gas supply pipe 244a, the MFC 244c, and the valve 244d. Alternatively, the second gas supply system 244 may be considered to include the second gas supply source 244b, the RPU 244e, and a second inert gas supply system to be described below. Further, the second gas supply system 244 belongs to another of the process gas supply systems because it supplies the second gas that is one of the process gases.

A downstream end of a second inert gas supply pipe 247a is connected to a downstream side of the gas supply pipe 244a relative to the valve 244d. The second inert gas supply pipe 247a is provided with an inert gas supply source 247b, a mass flow controller (MFC) 247c that is a flow rate controller (flow rate controller), and a valve 247d that is an opening/closing valve, sequentially from the upstream direction. Thus, the inert gas is supplied into the shower head 230 through the second inert gas supply pipe 247a via the MFC 247c, the valve 247d, the gas supply pipe 244a, the RPU 244e, and the second gas supply pipe 242.

The inert gas functions as a carrier gas or a dilution gas of the second gas. Specifically, the inert gas may use, for instance, nitrogen ($N_2$) gas. Further, in addition to the $N_2$ gas, a rare gas such as helium (He) gas, neon (Ne) gas or argon (Ar) gas may be used.

The second inert gas supply system is mainly constituted by the second inert gas supply pipe 247a, the MFC 247c, and the valve 247d. Alternatively, the second inert gas supply system may be considered to include the inert gas supply source 247b, the second gas supply pipe 244a, and the RPU 244e. Further, the second inert gas supply system may be considered to be included in the second gas supply system 244.

A gas supply unit is mainly constituted by the first gas supply system and the second gas supply system. Alternatively, the inert gas supply system and the shower head may be considered to be included in the gas supply unit. Further, the first gas and the second gas may be referred to collectively as a hard mask forming gas.

[Gas Exhaust System]

An exhaust system exhausting an atmosphere of the process container 202 includes an exhaust pipe 222 connected to the process container 202. The exhaust pipe 222 is connected to an interior of an exhaust buffer chamber 209 via an exhaust hole 221 formed in the top or side of the exhaust buffer chamber 209. The exhaust pipe 222 is provided with an auto pressure controller (APC) 223 that is a pressure controller for controlling the interior of the process chamber 201 communicating with the exhaust buffer chamber 209 at a predetermined pressure. The APC 223 includes a valve body (not shown) that can adjust a degree of valve opening, and adjusts conductance of the exhaust pipe 222 according to an instruction from the controller 260 to be described below. The exhaust pipe 222 is provided with an exhaust pump 224 at a downstream side of the APC 223. The exhaust pump 224 exhausts an atmosphere of the exhaust buffer chamber 209 and the atmosphere of the process chamber 201 communicating with the exhaust buffer chamber 209 via the exhaust pipe 222. Further, the exhaust pipe 222 is provided with a valve (not shown) at one or both of the downstream and upstream sides of the APC 223. The gas exhaust system is mainly constituted by the exhaust pipe 222, the APC 223, the exhaust pump 224, and the valve (not shown).

[Shower Head]

Figure 3:
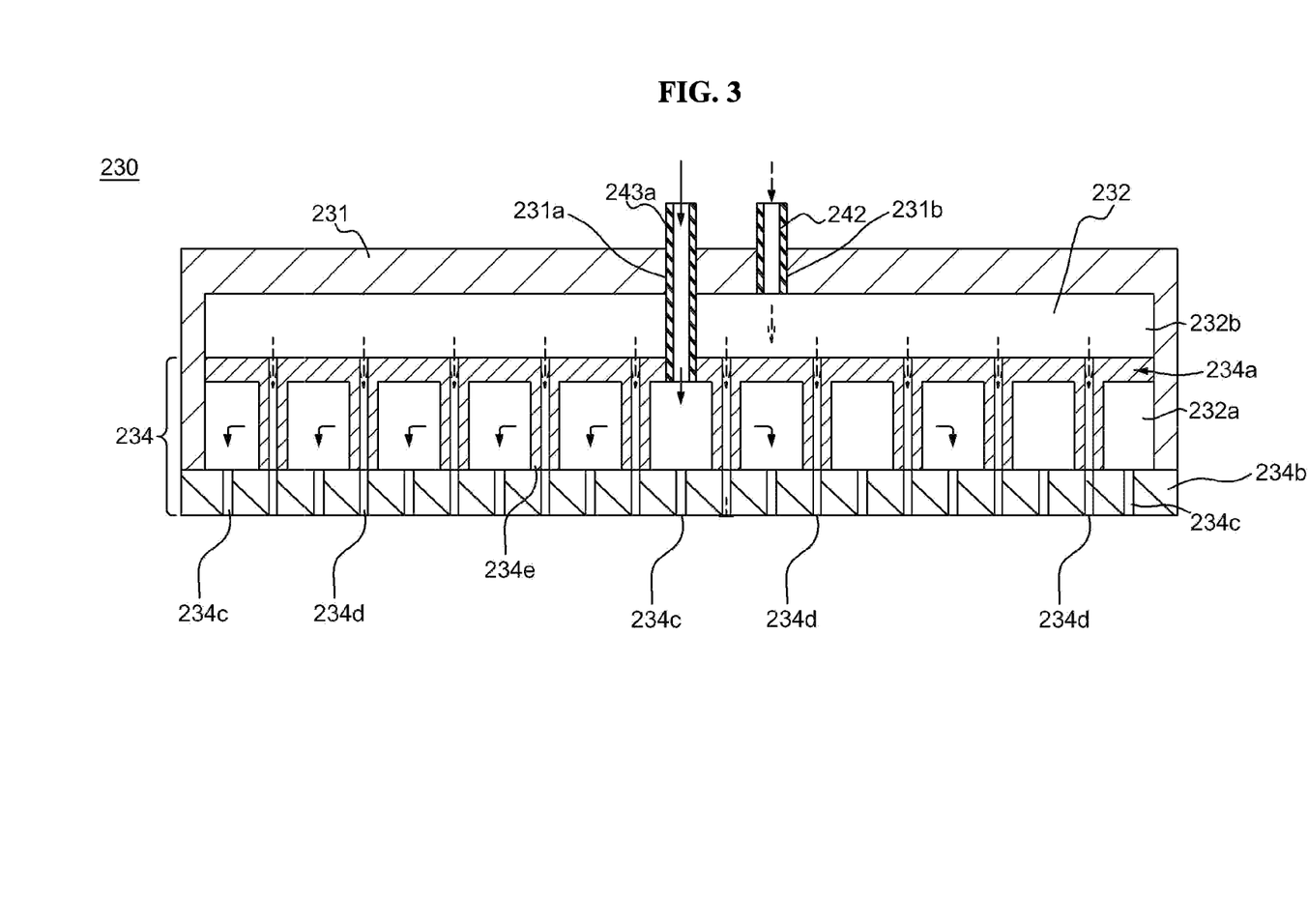
FIG. 3 is an explanatory view for describing a shower head of the single wafer type film forming apparatus according to the embodiment of the present invention.

Next, a detailed structure of the shower head 230 will be described using FIG. 3. The shower head 230 includes the first and second buffer spaces 232a and 232b, atmospheres of which are isolated from each other. To be specific, the first buffer space 232a is embedded in the dispersion plate 234, and is separated from the second buffer space 232b by an upper wall 234a that is a part of the dispersion plate 234.

The dispersion plate 234 includes a lower wall 234b abutting on the process chamber 201. The lower wall 234b is provided with the plurality of through-holes 234c that communicate with the first buffer space 232a. Further, the lower wall 234b is provided with the plurality of through-holes 234d that communicate with the second buffer space 232b. The through-holes 234c and 234d are alternately installed from the center to the periphery of the lower wall 234b, and are configured to uniformly supply the gas onto the wafer 200. Further, the through-holes 234d are embedded in pillars 234e connecting the upper wall 234a and the lower wall 234b.

The first gas supply pipe 243a is connected to the upper wall 234a via the gas inlet 231a and the second buffer space 232b. By this connection, the first gas supply pipe 243a communicates with the first buffer space 232a.

The first buffer space 232a is a space that includes the pillars 234e in which the through-holes 234d are embedded and communicates from the center to the periphery. The gas supplied through the first gas supply pipe 243a is dispersed in the first buffer space 232a, and is supplied into the process chamber 201 via the plurality of through-holes 234c.

The second buffer space 232b is disposed between the upper wall 234a and the cover 231. The upper wall 234a is provided with the through-holes 234d, and the second gas supply pipe 242 and the through-holes 234d communicate with each other. The gas supplied through the second gas supply pipe 242 is supplied into the process chamber 201 via the through-holes 234d.

[Controller]

The film forming apparatus 2000 includes the controller 260 that controls an operation of each part of the film forming apparatus 2000. The controller 260 at least includes an operation member 261 and a memory member 262. The controller 260 is connected to each of the aforementioned components, calls a program or a recipe from the memory member 262 according to an instruction of the controller or a user, and controls an operation of each component according to contents of the program or the recipe. Specifically, the controller 260 controls operations of the gate valve 205, the elevating mechanism 218, the heater 213, the MFCs 243c, 244c, 246c and 247c, the valves 243d, 244d, 246d and 247d, the APC 223, and the exhaust pump 224.

The controller 260 is connected to the film forming apparatus in the process. The controller 260 makes it possible to receive information about substrate processing of an etching process at an etching apparatus that is an apparatus different from the film forming apparatus. The controller 260 enables stand-alone control based on information about the film forming apparatus as well as control of each component based on information about an apparatus used in another process.

Further, the controller 260 may be embodied by a dedicated computer or a general-purpose computer. For example, an external memory device in which the aforementioned program is stored (for instance, a magnetic tape, a magnetic disc such as a flexible disc or a hard disc, an optical disc such as a compact disc (CD) or a digital versatile disc (DVD), a magneto-optical (MO) disc or a semiconductor memory such as a Universal Serial Bus (USB) memory or a memory card) is prepared, and a program is installed in the general-purpose computer using the external memory device 263. Thereby, the controller 260 according to the present embodiment can be configured.

Further, a means for supplying the program to the computer is not limited to supplying the program via the external memory device 263. For example, the program may be supplied using a telecommunication means such as the Internet or a private line without the external memory device 263. The memory member 262 or the external memory device 263 is embodied by a computer readable recording medium. Hereinafter, these are referred to collectively simply as a recording medium. The term recording medium used herein may include only the memory member 262, only the external memory device 263, or both.

(3) Film Forming Process

Figure 4:
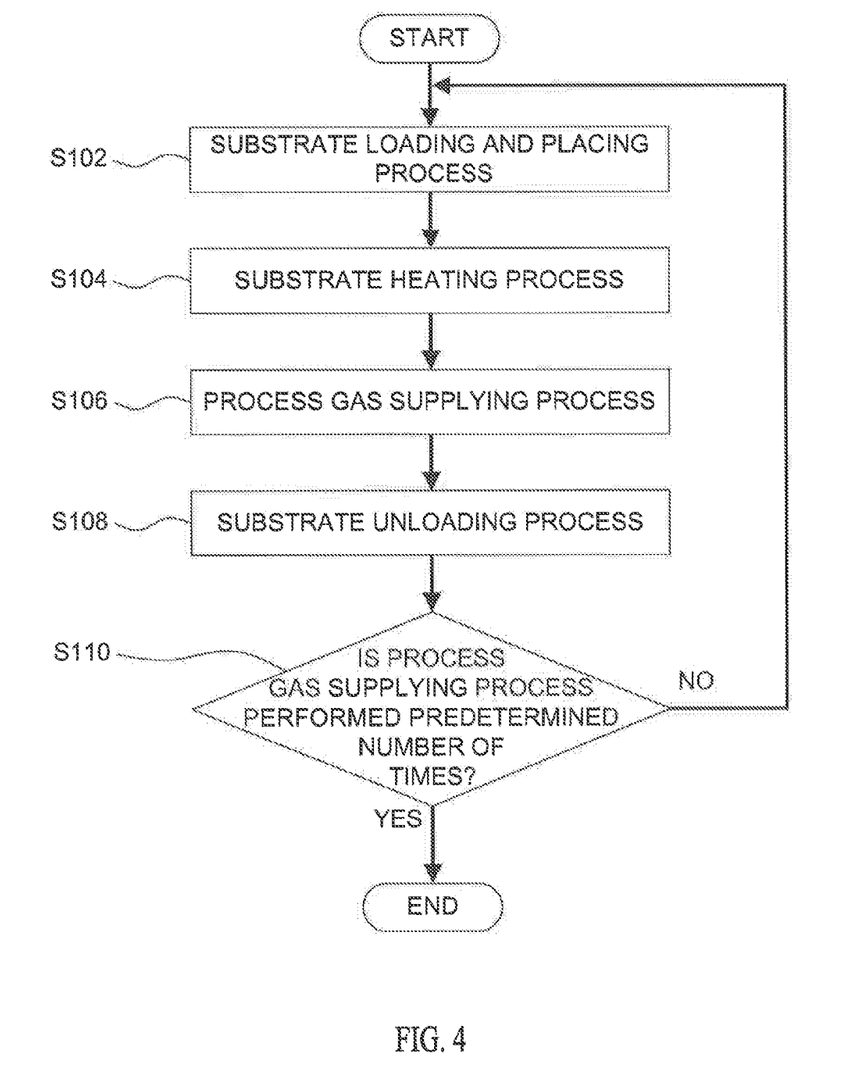
FIG. 4 is a flowchart for describing a film forming process according to an embodiment of the present invention.

Next, details of the film forming process (FIG. 1B) of forming the hard mask film using the film forming apparatus 2000 will be described using FIG. 4. A polycrystalline silicon film that is a film to be etched is formed on a target wafer. Further, in the following description, the operation of each part constituting the film forming apparatus 2000 is controlled by the controller 260.

Here, an example in which a silicon nitride (SiN) film acting as a silicon-containing film is formed on the wafer 200 using HCDS gas as the first gas (first process gas) and using $NH_3$ gas as the second gas (second process gas) will be described. Further, the SiN film is formed as the hard mask film 102.

[Substrate Loading and Placing Process S102]

In the film forming apparatus 2000, first, the substrate placement table 212 moves down to the transferring position of the wafer 200, and thereby the elevation pins 207 pass through the through-holes 214 of the substrate placement table 212. As a result, the elevation pins 207 protrude from the surface of the substrate placement table 212 by a predetermined height only. Subsequently, the gate valve 205 is opened to communicate the transfer space 203 with a transfer chamber (not shown). Then, the wafer 200 is loaded into the transfer space 203 from the transfer chamber using a wafer transfer machine (not shown), and the wafer 200 is transferred onto the elevation pins 207. Thereby, the wafer 200 is supported on the wafer elevation pins 207 protruding from the surface of the substrate placement table 212 in a horizontal posture.

When the wafer 200 is loaded into the process container 202, the wafer transfer machine is withdrawn outside the process container 202, the gate valve 205 is closed to seal the interior of the process container 202. Afterwards, the substrate placement table 212 moves up, and thereby the wafer 200 is placed on the substrate placement surface 211 provided for the substrate placement table 212. Further, the substrate placement table 212 moves up, and thereby the wafer 200 moves up to the processing position in the aforementioned process chamber 201.

When the wafer 200 is loaded into the transfer space 203 and then moves up to the processing position in the process chamber 201, the valve at the gas exhaust system is opened for communication between the exhaust buffer chamber 209 and the APC 223 and between the APC 223 and the exhaust pump 224. The APC 223 adjusts the conductance of the exhaust pipe 222, thereby controlling an exhaust flow rate of the exhaust buffer chamber 209 caused by the exhaust pump 224 to maintain the process chamber 201 communicating with the exhaust buffer chamber 209 at a predetermined pressure. Further, the valves of the other exhaust system are kept closed. Further, when the valve at the first gas exhaust system is closed, the valve located at an upstream side of a turbomolecular pump (TMP) is kept closed, and then the valve located at a downstream side of the TMP is kept closed. Thereby, an operation of the TMP is stably maintained.

[Substrate Heating Process S104]

Power is supplied to the center and outer zone heaters 213a and 213b embedded in the substrate placement table 212, and the surface of the wafer 200 is controlled to have a predetermined temperature distribution. At this time, temperatures of the center and outer zone heaters 213a and 213b are adjusted by controlling a state of electrical conduction to the heater 213 based on information about temperatures detected by the temperature measuring detectors 216a and 216b and information about a film after the etching process. At this time, the center and outer zone heaters 213a and 213b are controlled such that a temperature of the wafer 200 is, for instance, within a range of 250° C. to 700° C., preferably 300° C. to 650° C., and more preferably 350° C. to 600° C.

In this way, the heater 213 is controlled such that the surface temperature of the wafer 200 is within a predetermined range. Here, the substrate loading and placing process S102 and the substrate heating process S104 have been described as separate processes. However, without being limited thereto, the two processes may be performed in parallel.

[Process Gas Supply Process S106]

After the substrate heating process S104, a Process gas supply process S106 is performed next.

In the Process gas supply process S106, first, the valve 243d is opened, and the MFC 243c is controlled to supply the HCDS gas that is the first gas having a predetermined flow rate. In parallel with this, the valve 244d is opened, and the MFC 244c is controlled to supply the second gas having a predetermined flow rate. At this time, since the second gas passes through the RPU 244e operated previously, the ammonia gas that is the second gas is supplied into the process chamber 201 in a plasma state.

To be specific, when the first process gas (HCDS gas) is supplied, the valve 243d is opened, and the mass flow controller 243c is adjusted such that the flow rate of the first gas becomes a predetermined flow rate. Thereby, the first gas begins to be supplied into the process chamber 201. The supplied flow rate of the first gas is, for instance, 100 sccm to 500 sccm. The first gas is dispersed by the shower head 230, and is uniformly supplied onto the wafer 200 in the process chamber 201. At this time, the first process gas preferably uses a gas in which an influence of thermal energy is predominant. This is because the thermal energy is predominant and thus a film thickness is easily controlled by a temperature distribution control to be described below.

At this time, the valve 246d of the first inert gas supply system is opened to supply the inert gas ($N_2$ gas) through the first inert gas supply pipe 246a. A supplied flow rate of the inert gas is, for instance, 500 sccm to 5,000 sccm. Further, the inert gas may flow through a third gas supply pipe 245a of a purge gas supply system.

When the second process gas ($NH_3$ gas) is supplied, the valve 244d is opened, and the second gas begins to be supplied into the process chamber 201 via the RPU 244e and the shower head 230. At this time, the MFC 244c is adjusted such that the flow rate of the second gas becomes a predetermined flow rate. The supplied flow rate of the second gas is, for instance, 1,000 sccm to 10,000 sccm.

The second gas of the plasma state is dispersed by the shower head 230, is uniformly supplied onto the wafer 200 in the process chamber 201, reacts with the HCDS gas on the wafer 200, and generates the SiN film acting as the hard mask film on the wafer 200.

At this time, the valve 247d of the second inert gas supply system is opened to supply the inert gas ($N_2$ gas) through the second inert gas supply pipe 247a. A supplied flow rate of the inert gas is, for instance, 500 sccm to 5,000 sccm.

At this time, a process temperature and a process pressure in the process chamber 201 are controlled within a range in which the first gas and the second gas react to allow the SiN film to be formed. At this time, the pressure in the process chamber 201 is, for instance, set to a range of 1 Pa to 13,300 Pa, and preferably 20 Pa to 1,330 Pa.

[Substrate Unloading Process S108]

When the SiN film acting as the hard mask film is formed on the polycrystalline silicon film that is the film to be etched, the wafer 200 is unloaded in the reverse order of the substrate loading and placing process S102. After the unloading, the unprocessed wafer 200 on which the film to be etched is formed is loaded and subjected to the same processes.

[Process S110 of Deciding Number of Processed Wafers]

After the film forming process constituted of the aforementioned processes, it is decided whether the number of wafers 200 processed in the Process gas supply process S106 has reached a predetermined number (S110).

If the number of wafers 200 processed in the Process gas supply process S106 has not reached the predetermined number, the process proceeds to the substrate loading and placing process S102 in order to begin to process a new wafer 200 that is on standby. Further, when the Process gas supply process S106 is performed on the predetermined number of wafers 200, processing of one lot of the substrates is terminated.

As described in the aforementioned gate electrode forming process, after the hard mask film is formed in the film forming process, the resist film forming process and the exposure process are performed, and then the etching process is performed by the etching apparatus.

Meanwhile, after the etching process was terminated, a width of the pillar-shaped polycrystalline silicon film was checked. As a result, it was found that a width of the gate electrode formed of the poly-Si film within the surface of the substrate had a variation between the center of the wafer and the periphery of the wafer. As a result of intensive research by the inventor(s), it was found that an etch rate was different at the center of the wafer and the periphery of the wafer in the etching process, which was one cause of the variation.

Figure 5:
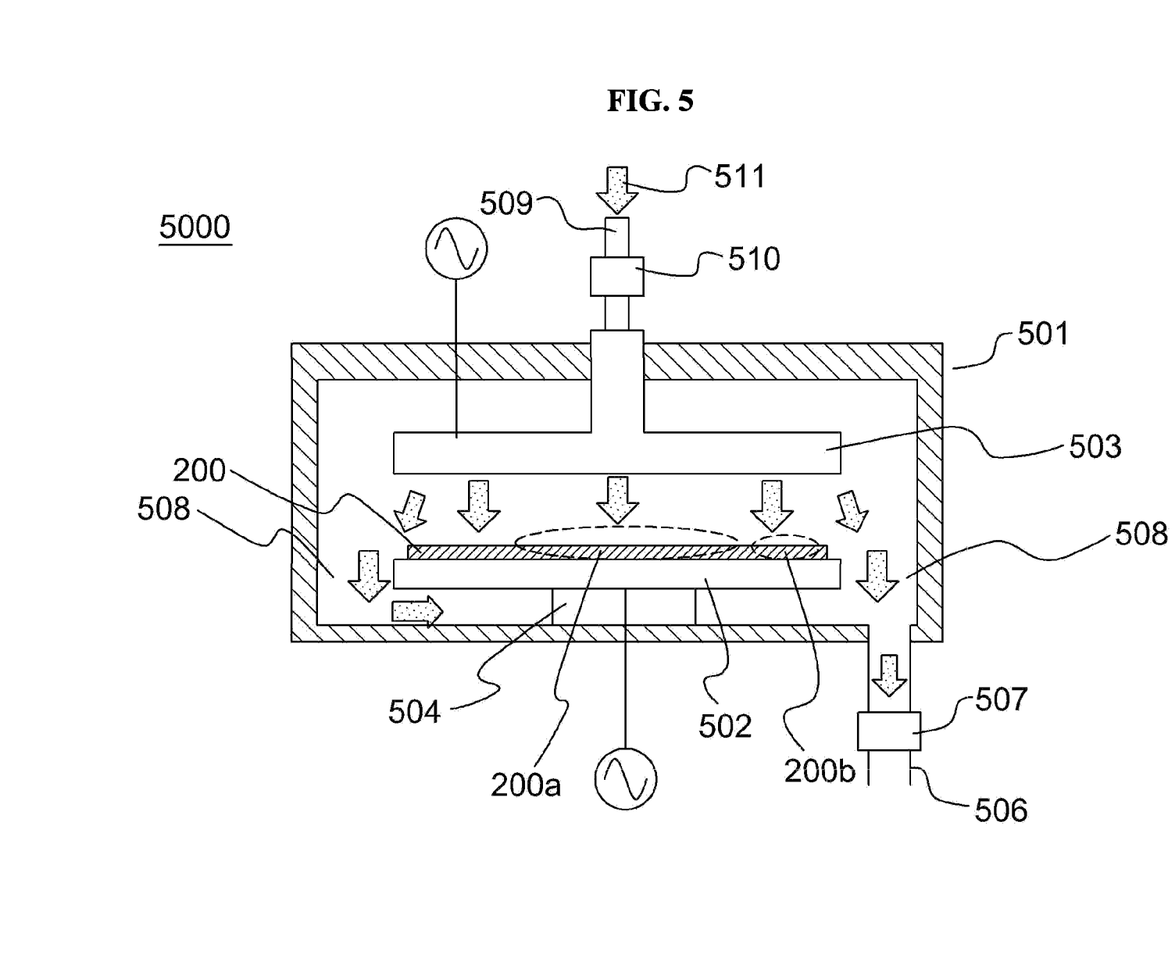
FIG. 5 is an explanatory view for describing an etching apparatus according to an embodiment of the present invention.

Hereinafter, the reason why the etch rate is different at the center of the wafer and the periphery of the wafer will be described. First, a typical etching apparatus will be described. When dry etching based on plasma is performed in an etching process, an etching apparatus 5000 as illustrated in, for instance, FIG. 5 is used. The etching apparatus 5000 includes parallel flat plasma electrodes in a container 501, and a supplied etching gas is induced to a plasma state by means of the plasma electrodes. In FIG. 5, a bottom electrode 502 that serves as the placement unit for placing the wafer 200 and a top electrode 503 that serves as the shower head for supplying the gas are embodied by the parallel flat electrodes. A power supply is connected to the electrodes.

In FIG. 5, a reference number 504 indicates a cylindrical support unit supporting the bottom electrode 502, and a reference number 506 indicates an exhaust pipe for exhausting an atmosphere in the container 501. The exhaust pipe 506 is provided with an exhaust controller 507 that includes, for instance, a valve to control an amount of exhaust. A pump is connected to a leading end of the exhaust pipe 506, and exhausts the atmosphere in the container 501. A flow path 508 is defined between the bottom electrode 502 and the container 501. The flow path 508 has an annular shape when viewed from the top.

A gas flow path is installed in the top electrode 503, and dispersion holes are provided in a surface of the top electrode 503 which faces the wafer 200. The gas flow path is connected to a gas supply pipe 509. The gas supply pipe is provided with a valve or a gas supply controller 510 such as a mass flow controller which controls the supply of the gas. The gas supply controller 510 controls, for instance, a flow rate of the gas supplied from an etching gas source (not shown). The gas 511 indicated by an arrow is supplied into a space between the top electrode 503 and the bottom electrode 502 via the top electrode 503. The supplied etching gas is induced to a plasma state by means of the top electrode 503 and the bottom electrode 502, and etches the film on the wafer 200.

The gas used for the etching is exhausted through the exhaust pipe 506 via the flow path 508. Subsequently, during the etching, a pressure in the process container 501 is adjusted to a desired pressure by cooperation of the gas supply controller 510 and the exhaust controller 507, and the etching process is performed.

When the substrate is processed by the single wafer type apparatus such as the etching apparatus 5000, the pressure in the process container 501 or the gas flow rate and the amount of exhaust are adjusted to predetermined process conditions, but the following problems may occur.

A first problem will be described. In the case of the etching apparatus 5000, because of a structural problem, the etching gas is exhausted through the exhaust pipe 506 via the flow path 508 at the periphery of the wafer 200. For example, when a volume of the etching gas to attack the wafer 200 is increased to reduce an etching time and to raise etching efficiency, the pressure in the process container 501 is increased, or a flow velocity when the gas is supplied and exhausted is increased such that the gas is easily diffused. In this case, the gas is supplied onto a peripheral portion 200b of the wafer at a faster velocity than onto a center portion 200a of the wafer. Thus, an amount of supply of the etching gas at the peripheral portion of the wafer is more than at the center portion of the wafer. That is, a plasma density of the peripheral portion of the wafer is higher than that of the center portion of the wafer. Due to this situation, an etch rate at the peripheral portion 200b of the wafer is thought to be higher an etch rate at the center portion 200a of the wafer.

A second problem will be described. For example, when the plasma density is increased to reduce the etching time and to raise the etching efficiency, it is thought that an amount of supply of the power to the electrodes is increased. However, since a magnetic field is concentrated on a space below a center portion of the top electrode 503 (i.e., a space above the center portion 200a of the wafer), the plasma density of the space below the center portion of the top electrode 503 becomes higher than that of a space below a peripheral portion of the top electrode 503 (i.e., a space above the peripheral portion 200b of the wafer). Due to this situation, the etch rate at the center portion 200a of the wafer is thought to be higher than the etch rate at the peripheral portion 200b of the wafer.

Next, a problem in which the etch rate is different in the center of the wafer and the periphery of the wafer will be described using FIGS. 6 and 7.

Figure 6:
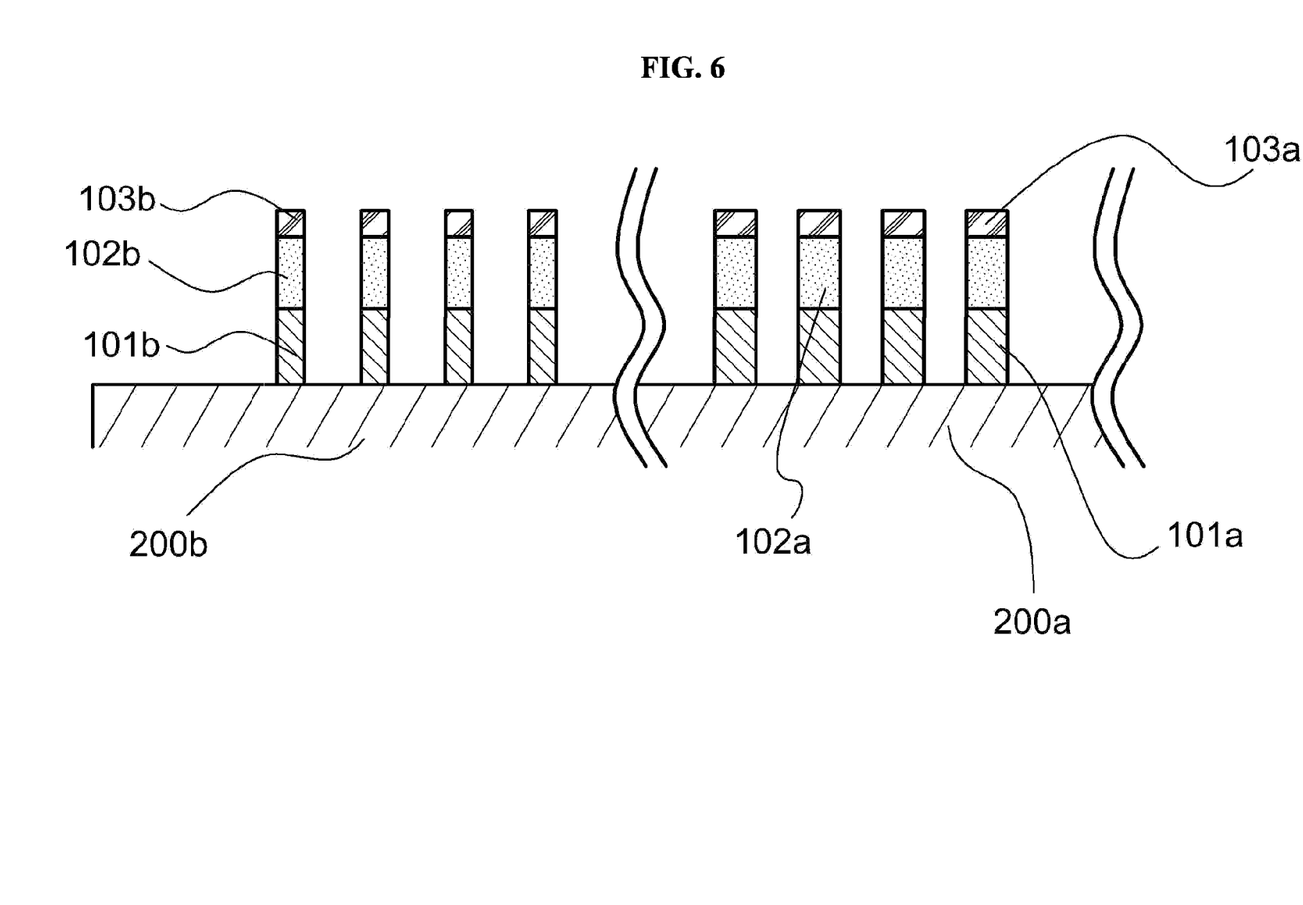
FIG. 6 is an explanatory view for describing a substrate on which an etching process is performed.

FIG. 6 is a view for describing the first problem in which the etch rate at the peripheral portion 200b of the wafer is higher than the etch rate at the center portion 200a of the wafer. Here, the etch rate at the center portion 200a of the wafer is defined as Ra1, and the etch rate at the peripheral portion 200b of the wafer is defined as Rb1. Further, a poly-Si film formed on the center portion 200a of the wafer is given a reference number 101a, a hard mask is given a reference number 102a, and a resist is given a reference number 103a. A poly-Si film formed on the peripheral portion 200b of the wafer is given a reference number 101b, a hard mask is given a reference number 102b, and a resist is given a reference number 103b.

When etching is performed according to the etching time of the etch rate Ra1 of the center side such that no etching residue is left on the center portion 200a of the wafer, the etch rate Rb1 of the peripheral side is higher, and thus an amount of supply of the etching gas onto the peripheral portion 200b of the wafer is more when compared to the center side.

As described above, with the recent miniaturization, the resist is thinned. When exposed to a large quantity of etching gas, the resist may also be etched. Further, since the resist itself is etched, an upper portion of the hard mask formed under the resist is exposed to the etching gas. The hard mask has etching resistance to some extent. However, when exposed to a large quantity of etching gas, the hard mask is etched. As a result, a widthwise part of the hard mask 102b is etched, and the hard mask 102b may not maintain a desired width. For this reason, the poly-Si film 101b has a shape of a plurality of pillars is etched under the hard mask 102b, and each pillar is made narrower than a desired width. Further, due to the exposure to the etching gas for a long time, the poly-Si film 101b is undercut and cannot maintain a desired width.

As in the above description, the poly-Si film 101b that is thinner than the poly-Si film 101a of the center portion 200a of the wafer is formed on the peripheral portion 200b of the wafer. Thus, a variation in the width of the gate electrode occurs between the center portion and the peripheral portion of the wafer 200.

Figure 7:
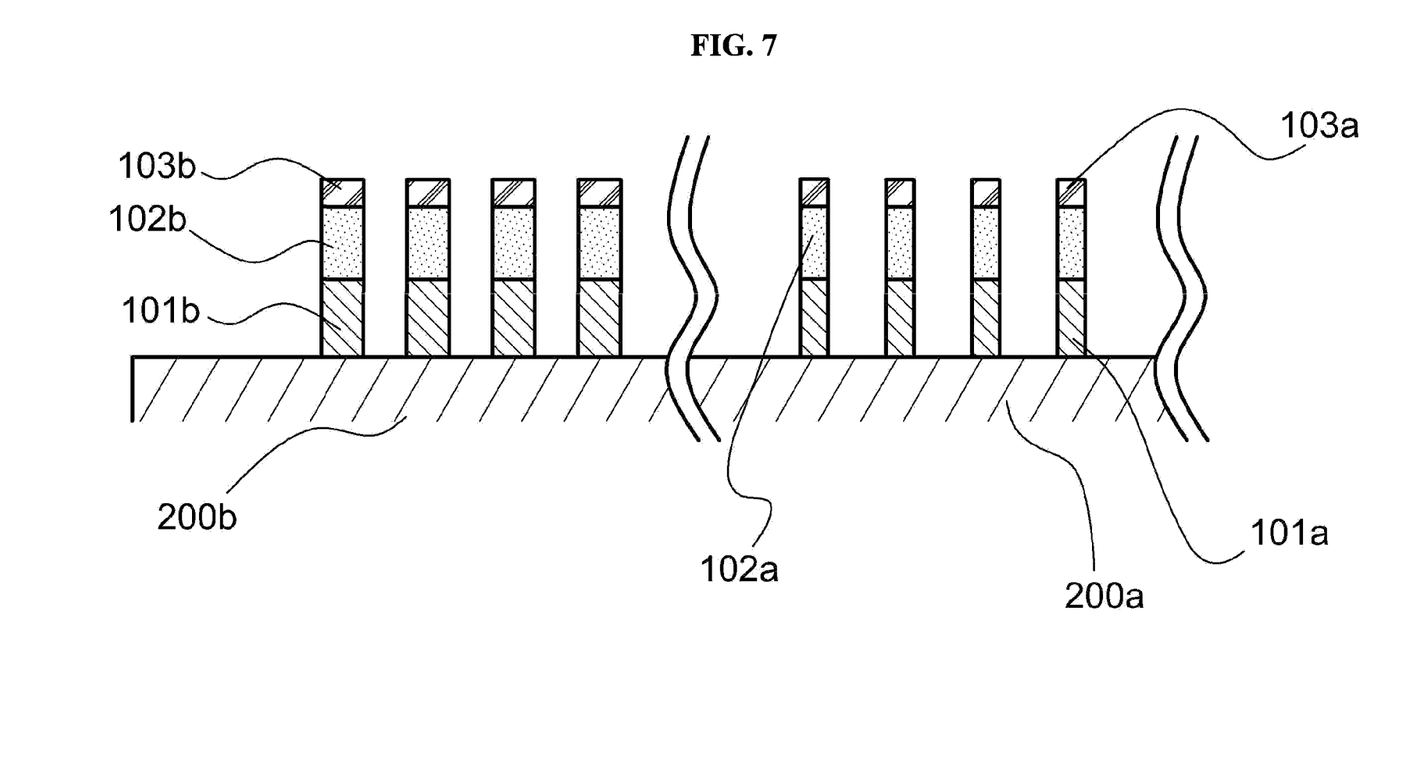
FIG. 7 is an explanatory view for describing a substrate on which an etching process is performed.

FIG. 7 is a view for describing the second problem of when the etch rate at the center portion 200a of the wafer is higher than the etch rate at the peripheral portion 200b of the wafer. Here, the etch rate at the center portion 200a of the wafer is defined as Ra2, and the etch rate at the peripheral portion of the wafer is defined as Rb2. Further, a poly-Si film formed on the center portion 200a of the wafer is given a reference number 101a, a hard mask is given a reference number 102a, and a resist is given a reference number 103a. A poly-Si film formed on the peripheral portion 200b of the wafer is given a reference number 101b, a hard mask is given a reference number 102b, and a resist is given a reference number 103b.

When etching is performed according to the etching time of the etch rate Rb2 of the peripheral side such that no etching residue is left on the peripheral portion 200b of the wafer, the etch rate Ra2 of the center side is higher, and thus an amount of supply of the etching gas onto the center portion 200a of the wafer is more when compared to the peripheral side.

As described above, with the recent miniaturization, the resist is thinned. When exposed to a large quantity of etching gas, the resist may also be etched. Further, since the resist itself is etched, an upper portion of the hard mask formed under the resist is exposed to the etching gas. The hard mask has etching resistance to some extent. However, when exposed to a large quantity of etching gas, the hard mask is etched. As a result, a widthwise part of the hard mask 102a is etched, and the hard mask 102a may not maintain a desired width. For this reason, the poly-Si film 101a formed under the hard mask 102a is also etched and made narrower than a desired width. Further, due to the exposure to the etching gas having a high plasma density, the poly-Si film 101a is undercut, and each pillar cannot maintain a desired width.

Due to this situation, as illustrated in FIG. 7, the pillar-shaped poly-Si film 101a that is thinner than the poly-Si film 101b of the peripheral portion 200b of the wafer is formed on the center portion 200a of the wafer. Thus, a variation in the width of the gate electrode occurs between the center portion and the peripheral portion of the wafer 200.

As described above, when the dry etching is performed, it is difficult to make the width of the gate electrode uniform in the surface of the wafer.

Thus, in the present embodiment, the hard mask is formed in the film forming process of the wafers $W_n$ of a lot (referred to as "$n^{th}$ lot") to be processed newly, a film thickness distribution is controlled according to the etching information about the wafers of a processed lot (referred to as "$m^{th}$ lot") in which the etching process is terminated such that a film thickness of the hard mask is made different at the center portion and the peripheral portion of the wafer 200. Here, the etching information refers to etch rates at the center portion and the peripheral portion of the wafer 200 and widths or distribution of the pillars of the film to be etched (poly-Si film 101) after the etching. The etch rates at the center portion and the peripheral portion of the wafer 200 are calculated from, for instance, etching results of the $m^{th}$ lot. The widths of the pillars of the film to be etched are measured using an existing measuring device after the etching process.

Hereinafter, a specific method of making the film thickness of the hard mask different at the center and peripheral portions of the wafer 200 and the reason why the film thickness is made different will be described. When viewed from the $n^{th}$ lot, each wafer of the $m^{th}$ lot is referred to as a "different substrate" or a "substrate $W_m$." In contrast, each wafer of the lot ($n^{th}$ lot) to be processed newly is referred to simply as a "substrate" or a "substrate $W_n$", where m and n are natural numbers. For example, when m=1 and n=2, the substrate $W_m$ indicates a substrate in the first lot and the substrate $W_n$ indicates a substrate in the second lot since the $n^{th}$ lot is processed after the $m^{th}$ lot is processed.

When the etching information about the different substrates (substrates $W_m$) of the $m^{th}$ lot in which the etching process is terminated indicates that a width of the poly-Si film 101a greater than that of the poly-Si film 101b as in FIG. 6 or that an etch rate at the peripheral portion 200b of the wafer is higher than the etch rate at the center portion 200a of the wafer, the film forming apparatus 2000 is controlled in processing of the $n^{th}$ lot such that the hard mask 102b of the peripheral portion 200b of the wafer is thicker than the hard mask 102a.

As a specific control, the Process gas supply process S106 is performed in a state in which a temperature of the outer zone heater 213b of the film forming apparatus 2000 is higher than that of the center zone heater 213a. More preferably, the temperature of the outer zone heater 213b, when the $W_n$ is processed, is higher than that when the $W_m$ is processed. Further, the temperature of the center zone heater 213a, when the $W_n$ is processed, is maintained as that when the $W_m$ is processed.

When the temperature of the wafer is high, a reaction of the gas is accelerated, and a film formation rate of the hard mask film 102 is increased. Therefore, the hard mask 102b has a greater thickness than the hard mask 102a. At this time, the thicknesses of the hard masks 102a and 102b are at least set to such thicknesses that the poly-Si film 101 is not exposed within a predetermined etching time.

When it is assumed that the thickness of the hard mask 102a is Ha1, the thickness of the hard mask 102b is Hb1, and the etching process time is t, relations of "Ha1>Ra1×t" and "Hb1>Rb1×t" are preferably satisfied. With these relations, overetching or undercutting of the hard mask can be more reliably prevented even though the etch rate at the peripheral portion of the wafer is higher than the etch rate at the center portion. Therefore, the width of the gate electrode can be made uniform in the surface of the wafer.

Further, when the etching information about the different substrates (substrates $W_m$) of the $m^{th}$ lot in which the etching process is terminated indicates that a width of the poly-Si film 101b is greater than that of the poly-Si film 101a as in FIG. 7 or that the etch rate at the center portion 200a of the wafer is higher than the etch rate at the peripheral portion 200b of the wafer, the hard mask 102a of the center portion 200a of the wafer is controlled to be thicker than the hard mask 102b in the processing of the $n^{th}$ lot.

As a specific control, the Process gas supply process S106 is performed in a state in which a temperature of the center zone heater 213a of the film forming apparatus 2000 is higher than that of the outer zone heater 213b, and the temperature distribution is controlled such that the film thickness distribution is within a predetermined range. More preferably, the temperature of the outer zone heater 213b when the $W_n$, is processed, is maintained as that when the $W_m$ is processed. Further, the temperature of the center zone heater 213a, when the $W_n$ is processed, is higher than that when the $W_m$ is processed.

As described above, when the temperature of the wafer is high, the reaction of the gas is accelerated, and the film formation rate of the hard mask film 102 is increased. Therefore, the hard mask 102a has a greater thickness than the hard mask 102b. At this time, the thicknesses of the hard masks 102a and 102b are at least set to such thicknesses that the poly-Si film 101 is not exposed within a predetermined etching time.

When it is assumed that the thickness of the hard mask 102a be Ha2, the thickness of the hard mask 102b be Hb2, and the etching process time be t, relations of "Ha2>Ra2×t" and "Hb2>Rb2×t" are preferably satisfied. With these relations, the overetching or the undercutting of the hard mask can be more reliably prevented although the etch rate at the center portion of the wafer is higher than the etch rate at the peripheral portion. Therefore, the width of the gate electrode can be made uniform in the surface of the wafer.

In this way, according to the present invention, even though there is a variation in the width of the poly-Si film after the etching process at the preceding lot ($m^{th}$ lot), the film thickness of the hard mask is adjusted in the subsequent lot ($n^{th}$ lot) based on the etching information of the $m^{th}$ lot, and thus the width of the poly-Si film can be formed within a desired range.

Further, in the aforementioned embodiment, it has described that the wafer 200 is divided into the center portion and peripheral portion. However, without being limited thereto, the temperature of the wafer may be controlled in more subdivided portions from the center portion of the wafer 200 to the peripheral portion. For example, the wafer may be divided into three portions of a center portion, a peripheral portion and a portion between the center portion and the peripheral portion.

Here, as the hard mask, the silicon nitride film has been described by way of example. However, without being limited thereto, the hard mask may be a silicon oxide film.

Further, as the silicon-containing gas, a gas in which an influence of thermal energy is predominant, such as HCDS used in the description of the present embodiment, is preferably used. This is because, due to the predominant thermal energy, the film thickness is easily controlled by the control of the temperature distribution.

Further, as the silicon-containing gas, in addition to HCDS, dichlorosilane (DCS) and aminosilane-based organic raw materials such as tetrakis(dimethylamino)silane (4DMAS, $Si[N(CH_3)_2]_4$), tris(dimethylamino)silane (3DMAS, $Si[N(CH_3)_2]_3H$), bisdiethylaminosilane (2DEAS, $Si[N(C_2H_5)_2]_2H_2$), bis(tertiarybutylamino)silane (BTBAS, $SiH_2[NH(C_4H_9)]_2$) and the like may be used. Further, tetrachlorosilane (TCS, $SiCl_4$), monosilane ($SiH_4$), disilane ($Si_2H_6$) and the like may be used.

Further, as the nitrogen-containing gas, in addition to $NH_3$ gas, $N_2$ gas, $N_2H_4$ gas or $N_3H_8$ gas may be used.

Further, as the processing of the $m^{th}$ lot, the substrate converted into a product has been described. However, without being limited thereto, a dummy substrate that is not converted into a product may be used.

Further, in the present embodiment, the technique for reacting two gases to form the film on the substrate has been described by way of example. However, without being limited thereto, for example, one gas or three or more gases may be used if the film can be formed.

Further, in the present embodiment, the two gases are supplied into the process chamber so as to be present at the same time. However, without being limited thereto, for example, the gases may be alternately supplied into the process chamber.

According to the present invention, it is possible to provide a configuration capable of suppressing a variation in width of a gate electrode.

PREFERRED EMBODIMENTS OF THE PRESENT INVENTION

Hereinafter, preferred embodiments according to the present invention are supplementarily noted.

Supplementary Note 1

According to an aspect of the present invention, there is provided a substrate processing apparatus including: a process chamber; a gas supply unit configured to supply a hard mask forming gas into the process chamber; a substrate support table configured to support a substrate $W_n$ of an $n^{th}$ lot having a film to be etched formed thereon; a heater embedded in the substrate support table; and a controller configured to control a temperature distribution of the heater based on etching information of a substrate $W_m$ of an $m^{th}$ lot processed prior to the $n^{th}$ lot.

Supplementary Note 2

In the substrate processing apparatus of Supplementary note 1, preferably, the etching information of the substrate $W_m$ includes at least one of information on etch rates at a center portion and a peripheral portion of a surface of the substrate $W_m$ and information on widths of a film to be etched at the center portion and the peripheral portion of the surface of the substrate $W_m$.

Supplementary Note 3

In the substrate processing apparatus of Supplementary note 2, preferably, the controller is configured to control the temperature distribution such that a hard mask film formed at a peripheral portion of a surface of the substrate $W_n$ is thicker than the hard mask film formed at a center portion of the surface of the substrate $W_n$ when the etching information of the substrate $W_m$ indicates an etch rate at a peripheral portion of a surface of the substrate $W_m$ is greater than an etch rate at a center portion of the surface of the substrate $W_m$.

Supplementary Note 4

In the substrate processing apparatus of Supplementary note 3, preferably, the heater includes a center zone heater configured to heat the center portion of the surface of the substrate $W_n$ and an outer zone heater configured to heat the peripheral portion of the surface of the substrate $W_n$, and the controller is configured to control the center zone heater and the outer zone heater in a manner so that a temperature of the outer zone heater is higher than a temperature of the center zone heater.

Supplementary Note 5

In the substrate processing apparatus of Supplementary note 4, preferably, the controller is configured to control the temperature distribution such that the temperature of the outer zone heater when the hard mask film is formed on the substrate $W_n$ is higher than a temperature of the outer zone heater when a hard mask film is formed on the substrate $W_m$.

Supplementary Note 6

In the substrate processing apparatus of Supplementary note 5, preferably, the controller is configured to control the temperature distribution such that the temperature of the center zone heater when the hard mask film is formed on the substrate $W_n$ is maintained at the temperature of the center zone heater when the hard mask film is formed on the substrate $W_m$.

Supplementary Note 7

In the substrate processing apparatus of Supplementary note 2, preferably, the controller is configured to control the temperature distribution such that a hard mask film formed at a peripheral portion of a surface of the substrate $W_n$ is thicker than the hard mask film formed at a center portion of the surface of the substrate $W_n$ when the etching information of the substrate $W_m$ indicates a film to be etched at a peripheral portion of a surface of the substrate $W_m$ is narrower than a film to be etched at a center portion of the surface of the substrate $W_m$.

Supplementary Note 8

In the substrate processing apparatus of Supplementary note 7, preferably, the heater includes a center zone heater configured to heat the center portion of the surface of the substrate $W_n$ and an outer zone heater configured to heat the peripheral portion of the surface of the substrate $W_n$, and the controller is configured to control the center zone heater and the outer zone heater in a manner so that a temperature of the outer zone heater is higher than a temperature of the center zone heater.

Supplementary Note 9

In the substrate processing apparatus of Supplementary note 8, preferably, the controller is configured to control the temperature distribution such that the temperature of the outer zone heater when the hard mask film is formed on the substrate $W_n$ is higher than a temperature of the outer zone heater when the hard mask film is formed on the substrate $W_m$.

Supplementary Note 10

In the substrate processing apparatus of Supplementary note 9, preferably, the controller is configured to control the temperature distribution such that the temperature of the center zone heater when the hard mask film is formed on the substrate $W_n$ is maintained at the temperature of the center zone heater when a hard mask film is formed on the substrate $W_m$.

Supplementary Note 11

In the substrate processing apparatus of Supplementary note 2, preferably, the controller is configured to control the temperature distribution such that a hard mask film formed at a center portion of a surface of the substrate $W_n$ is thicker than the hard mask film formed at a peripheral portion of the surface of the substrate $W_n$ when the etching information of the substrate $W_m$ indicates an etch rate at a peripheral portion of a surface of the substrate $W_m$ is less than an etch rate at a center portion of the surface of the substrate $W_m$.

Supplementary Note 12

In the substrate processing apparatus of Supplementary note 11, preferably, the heater includes a center zone heater configured to heat the center portion of the surface of the substrate $W_n$ and an outer zone heater configured to heat the peripheral portion of the surface of the substrate $W_n$, and the controller is configured to control the center zone heater and the outer zone heater in a manner that a temperature of the center zone heater is higher than a temperature of the outer zone heater.

Supplementary Note 13

In the substrate processing apparatus of Supplementary note 12, preferably, the controller is configured to control the temperature distribution such that the temperature of the center zone heater when the hard mask film is formed on the substrate $W_n$ is higher than a temperature of the center zone heater when a hard mask film is formed on the substrate $W_m$.

Supplementary Note 14

In the substrate processing apparatus of Supplementary note 13, preferably, the controller is configured to control the temperature distribution such that the temperature of the outer zone heater when the hard mask film is formed on the substrate $W_n$ is maintained at the temperature of the outer zone heater when the hard mask film is formed on the substrate $W_m$.

Supplementary Note 15

In the substrate processing apparatus of Supplementary note 2, preferably, the controller is configured to control the temperature distribution such that a hard mask film formed at a center portion of a surface of the substrate $W_n$ is thicker than the hard mask film formed at a peripheral portion of the surface of the substrate $W_n$ when the etching information of the substrate $W_m$ indicates a film to be etched at a peripheral portion of a surface of the substrate $W_m$ is wider than a film to be etched at a center portion of the surface of the substrate $W_m$.

Supplementary Note 16

In the substrate processing apparatus of Supplementary note 15, preferably, the heater includes a center zone heater configured to heat the center portion of the surface of the substrate $W_n$ and an outer zone heater configured to heat the peripheral portion of the surface of the substrate $W_n$, and the controller is configured to control the center zone heater and the outer zone heater in a manner that a temperature of the center zone heater is higher than a temperature of the outer zone heater.

Supplementary Note 17

In the substrate processing apparatus of Supplementary note 16, preferably, the controller is configured to control the temperature distribution such that the temperature of the center zone heater when the hard mask film is formed on the substrate $W_n$ is higher than a temperature of the center zone heater when a hard mask film is formed on the substrate $W_m$.

Supplementary Note 18

In the substrate processing apparatus of Supplementary note 17, preferably, the controller is configured to control the temperature distribution such that the temperature of the outer zone heater when the hard mask film is formed on the substrate $W_n$ is maintained at the temperature of the outer zone heater when the hard mask film is formed on the substrate $W_m$.

Supplementary Note 19

In the substrate processing apparatus of any one of Supplementary notes 1 through 18, preferably, a hard mask film formed by the hard mask forming gas includes a silicon nitride film.

Supplementary Note 20

In the substrate processing apparatus of any one of Supplementary notes 1 through 19, preferably, the film to be etched includes a gate electrode layer.

Supplementary Note 21

According to another aspect of the present invention, there is provided a method of manufacturing a semiconductor device including: (a) placing a substrate $W_n$ of an $n^{th}$ lot having a film to be etched formed thereon on a substrate support accommodated in a process chamber; (b) controlling a surface temperature distribution of the substrate $W_n$ based on an etching information of a substrate $W_m$ of an $m^{th}$ lot processed prior to the $n^{th}$ lot; and (c) supplying a hard mask forming gas into the process chamber.

Supplementary Note 22

According to still another aspect of the present invention, there is provided a program causing a computer to perform: (a) placing a substrate $W_n$ of an $n^{th}$ lot having a film to be etched formed thereon on a substrate support accommodated in a process chamber; (b) controlling a surface temperature distribution of the substrate $W_n$ based on an etching information of a substrate $W_m$ of an $m^{th}$ lot processed prior to the $n^{th}$ lot; and (c) supplying a hard mask forming gas into the process chamber.

Supplementary Note 23

According to still another aspect of the present invention, there is provided a non-transitory computer-readable recording medium storing a program causing a computer to perform: (a) placing a substrate $W_n$ of an $n^{th}$ lot having a film to be etched formed thereon on a substrate support accommodated in a process chamber; (b) controlling a surface temperature distribution of the substrate $W_n$ based on an etching information of a substrate $W_m$ of an $m^{th}$ lot processed prior to the $n^{th}$ lot; and (c) supplying a hard mask forming gas into the process chamber.

What is claimed is:

1. A method of manufacturing a semiconductor device comprising:
   (a) placing a substrate $W_n$ of an $n^{th}$ lot having a film to be etched formed thereon on a substrate support accommodated in a process chamber;
   (b) controlling a surface temperature distribution of the substrate $W_n$ based on an etching information of a substrate $W_m$ of an $m^{th}$ lot processed prior to the $n^{th}$ lot wherein the etching information comprises at least one of in situ information on etch rates at a center portion and a peripheral portion of a surface of the substrate $W_m$ and in situ information on widths of the film to be etched at the center portion and the peripheral portion of the surface of the substrate $W_m$; and
   (c) supplying a hard mask forming gas into the process chamber after performing (b).

2. The method of claim 1, wherein a hard mask film formed at a peripheral portion of a surface of the substrate $W_n$ is thicker than the hard mask film formed at a center portion of the surface of the substrate $W_n$ in (c) by controlling the surface temperature distribution of the substrate $W_n$ in (b) when the etching information indicates the etch rate at the peripheral portion of the surface of the substrate $W_m$ is greater than the etch rate at the center portion of the surface of the substrate $W_m$.

3. The method of claim 1, wherein a hard mask film formed at a peripheral portion of a surface of the substrate $W_n$ is thicker than the hard mask film formed at a center portion of the surface of the substrate $W_n$ in (c) by controlling the surface temperature distribution of the substrate $W_n$ in (b) when the etching information indicates the film to be etched at the peripheral portion of the surface of the substrate $W_m$ is narrower than the film to be etched at the center portion of the surface of the substrate $W_m$.

4. The method of claim 1, wherein a hard mask film formed at a center portion of a surface of the substrate $W_n$ is thicker than the hard mask film formed at a peripheral portion of the surface of the substrate $W_n$ in (c) by controlling the surface temperature distribution of the substrate $W_n$ in (b) when the etching information indicates the etch rate at the peripheral portion of the surface of the substrate $W_m$ is less than the etch rate at the center portion of the surface of the substrate $W_m$.

5. The method of claim 1, wherein a hard mask film formed at a center portion of a surface of the substrate $W_n$ is thicker than the hard mask film formed at a peripheral portion of the surface of the substrate $W_n$ in (c) by controlling the surface temperature distribution of the substrate $W_n$ in (b) when the etching information indicates the film to be etched at the peripheral portion of the surface of the substrate $W_m$ is narrower than the film to be etched at the center portion of the surface of the substrate $W_m$.

6. The method of claim 1, wherein a hard mask film formed by the hard mask forming gas comprises a silicon nitride film.

7. The method of claim 1, wherein the film to be etched comprises a gate electrode layer.

8. The method of claim 2, wherein the surface temperature distribution of the substrate $W_n$ is controlled in (b) by heating the substrate $W_n$ such that a temperature of the peripheral portion of the surface of the substrate $W_n$ is higher than that of the center portion of the surface of the substrate $W_n$.

9. The method of claim 8, wherein the temperature of the peripheral portion of the surface of the substrate $W_n$ when the hard mask film is formed on the substrate $W_n$ is higher than a temperature of the peripheral portion of the surface of the substrate $W_m$ when the hard mask film is formed on the substrate $W_m$.

10. The method of claim 3, wherein the surface temperature distribution of the substrate $W_n$ is controlled in (b) by heating the substrate $W_n$ such that a temperature of the peripheral portion of the surface of the substrate $W_n$ is higher than that of the center portion of the surface of the substrate $W_n$.

11. The method of claim 10, wherein the temperature of the peripheral portion of the surface of the substrate $W_n$ when the hard mask film is formed on the substrate $W_n$ is higher than a temperature of the peripheral portion of the surface of the substrate $W_m$ when the hard mask film is formed on the substrate $W_m$.

12. The method of claim 4, wherein the surface temperature distribution of the substrate $W_n$ is controlled in (b) by heating the substrate $W_n$ such that a temperature of the center portion of the surface of the substrate $W_n$ is higher than that of the peripheral portion of the surface of the substrate $W_n$.

13. The method of claim 12, wherein the temperature of the center portion of the surface of the substrate $W_n$ when the hard mask film is formed on the substrate $W_n$ is higher than a temperature of the center portion of the surface of the substrate $W_m$ when the hard mask film is formed on the substrate $W_m$.

14. The method of claim 13, wherein the temperature of the peripheral portion of the surface of the substrate $W_n$ when the hard mask film is formed on the substrate $W_n$ is maintained at a temperature of the peripheral portion of the surface of the substrate $W_m$ when the hard mask film is formed on the substrate $W_m$.

15. The method of claim 5, wherein the surface temperature distribution of the substrate $W_n$ is controlled in (b) by heating the substrate $W_n$ such that a temperature of the center portion of the surface of the substrate $W_n$ is higher than that of the peripheral portion of the surface of the substrate $W_n$.

16. The method of claim 15, wherein the temperature of the center portion of the surface of the substrate $W_n$ when the hard mask film is formed on the substrate $W_n$ is higher than a temperature of the center portion of the surface of the substrate $W_m$ when the hard mask film is formed on the substrate $W_m$.

17. The method of claim 16, wherein the temperature of the peripheral portion of the surface of the substrate $W_n$ when the hard mask film is formed on the substrate $W_n$ is maintained at a temperature of the peripheral portion of the surface of the substrate $W_m$ when the hard mask film is formed on the substrate $W_m$.

18. A non-transitory computer-readable recording medium storing a program causing a computer to perform:
   (a) placing a substrate $W_n$ of an $n^{th}$ lot having a film to be etched formed thereon on a substrate support accommodated in a process chamber;
   (b) controlling a surface temperature distribution of the substrate $W_n$ based on an etching information of a substrate $W_m$ of an $m^{th}$ lot processed prior to the $n^{th}$ lot wherein the etching information comprises at least one of in situ information on etch rates at a center portion and a peripheral portion of a surface of the substrate $W_m$ and in situ information on widths of the film to be etched at the center portion and the peripheral portion of the surface of the substrate $W_m$; and
   (c) supplying a hard mask forming gas into the process chamber after performing (b).

* * * * *